United States Patent [19]
Shoji

[11] Patent Number: 6,054,171
[45] Date of Patent: Apr. 25, 2000

[54] METHOD FOR FORMING PROTRUDING ELECTRODE

[75] Inventor: Kazutaka Shoji, Tokyo, Japan

[73] Assignee: NEC Corporation, Japan

[21] Appl. No.: 08/932,443

[22] Filed: Sep. 19, 1997

[30] Foreign Application Priority Data

Sep. 20, 1996 [JP] Japan .................................. 8-249969

[51] Int. Cl.[7] .............................. B05D 5/12; H01L 21/44; B23K 35/14
[52] U.S. Cl. ........................ 427/96; 427/259; 427/372.2; 427/282; 438/613; 228/254; 228/180.22; 228/56.3
[58] Field of Search .............................. 427/96, 560, 282, 427/259, 146, 372.2; 29/840; 228/254, 180.22, 56.3; 438/613

[56] References Cited

U.S. PATENT DOCUMENTS

| | | | |
|---|---|---|---|
| 4,604,644 | 8/1986 | Beckham et al. | 357/80 |
| 5,147,084 | 9/1992 | Behun et al. | 228/56.3 |
| 5,371,328 | 12/1994 | Gutierrez et al. | 174/262 |
| 5,411,760 | 5/1995 | Woodhall et al. | 427/156 |
| 5,656,862 | 8/1997 | Papathomas et al. | 257/778 |

FOREIGN PATENT DOCUMENTS

| | | | |
|---|---|---|---|
| 107641 | 6/1983 | Japan . | |
| 66326 | 3/1995 | Japan . | |
| 17860 | 1/1996 | Japan . | |
| 8301 | 1/1996 | Japan . | |
| 172114 | 7/1996 | Japan . | |
| 8236654 | 9/1996 | Japan . | |
| 9298356 | 11/1997 | Japan . | |
| WO 9403971 | 2/1994 | WIPO | H03B 5/18 |

*Primary Examiner*—Brian K. Talbot
*Attorney, Agent, or Firm*—Hayes, Soloway, Hennessey, Grossman & Hage, P.C.

[57] ABSTRACT

Disclosed is a method for forming a protruding electrode which has the steps of: forming a first film of an organic or polymeric material on the top portion of a protruding electrode formed on a protruding-electrode-forming plane; then forming a second film of a polymeric material on the protruding-electrode-forming plane to bury the base portion of the protruding electrode; and removing the first film after the second film is cured; wherein the first film is of the organic or polymeric material which has no affinity with the polymeric material of the second film.

16 Claims, 3 Drawing Sheets

METHOD FOR FORMING PROTRUDING ELECTRODE

FIELD OF THE INVENTION

This invention relates to a method for forming a protruding electrode(hereinafter also referred to as 'bump') which is used in an electrical connection between a semiconductor chip or a semiconductor device and a mount substrate.

BACKGROUND OF THE INVENTION

Flip chip bonding is known as a method for mounting a semiconductor chip on a substrate. The flip flop bonding is conducted by forming a bump(protruding electrode) made of gold or solder on an electrode of a semiconductor chip, then heating and fusing by thermo-compression or reflow furnace while placing the bump on a land of the substrate, then cooling. FIG. 1 shows an example were a semiconductor chip is mounted on a substrate by flip flop bonding. In FIG. 1, 1 is a semiconductor chip, 2 is a bump made of solder ball which is formed on the semiconductor chip 1, and 3 is a substrate(printed board). The substrate 3 is composed of a base material 3a made of synthetic resin, and a wiring pattern(not shown) and a solder resist layer 4 which are formed on the mount plane(upper surface in FIG. 1) of the base material 3a. The bump 2 is bonded to a land for soldering on the wiring pattern.

On the other hand, when a semiconductor device where a semiconductor chip is mounted on a printed circuit board and sealed is mounted on a mount board, the semiconductor device is generally formed into BGA(ball grid array) and then is soldered by reflow furnace like the flip chip bonding. The BGA type semiconductor device has a structure where many solder bumps are two-dimensionally formed on the back surface of the printed circuit board on which the semiconductor chip is mounted. This structure is similar to the structure shown in FIG. 1.

However, in the semiconductor chip 1 or BGA type semiconductor device with bumps 2 to be mounted on the substrate, there may occur a crack 5 at the base portion of the bump 2 after using it for a long time. It is understood that the crack 5 is caused by that the thermal expansion coefficient of the semiconductor chip 1 or BGA type semiconductor device is different from the thermal expansion coefficient of the mount board.

Namely, the thermal expansion coefficient of the semiconductor chip 1 made of silicon is much smaller than that of the substrate 3 made of synthetic resin. Therefore, when the semiconductor chip 1 and substrate 3 are heated by heat generated by the operation of the semiconductor chip 1 or by the other electronic components, there occurs an expansion difference between them as shown by arrows in FIG. 1. As a result, a shearing stress(thermal stress) occurs at the bump 2 interposing between them, thereby causing the crack 5 at the bump 2.

This problem can be, to some degree, solved by filling with synthetic resin between the semiconductor chip 1 and the substrate 3, as shown in FIGS. 2 and 3, to suppress such a relative shifting.

For example, such a solution is disclosed in Japanese patent application laid-open No. 4-219944 (1992) which shows a mount structure as shown in FIGS. 2 and 3, where like parts are indicated by like reference numerals as used in FIG. 1 and detailed explanations thereof will be therefore omitted.

As shown in FIG. 2, between the semiconductor chip 1 and the substrate 3, thermosetting resin 6 is filled and cured. When the thermosetting resin 6 is filled therebetween, the substrate 3 is, as shown in FIG. 3, declined after mounting the semiconductor chip 1 on the substrate 3, and then the thermosetting resin 6 in a liquid state is injected to a clearance therebetween by using an injection nozzle 7. The thermosetting resin 6 is liquified with a low viscosity and flows into the clearance therebetween by capillary action.

However, in this method, there is a problem that the semiconductor chip 1 or substrate 3 cannot be replaced even when a defective part of the semiconductor chip 1 or substrate is detected on the next process, after the semiconductor chip 1 is adhered to the substrate 3 through the thermosetting resin 6 as shown in FIG. 2.

SUMMARY OF THE INVENTION

Accordingly, it is an object of the invention to provide a method for forming a protruding electrode where resistance against thermal stress in protruding electrode can be improved.

It is a further object of the invention to provide a method for forming a protruding electrode where a semiconductor chip or a semiconductor device can be easily separated from a mount substrate even after mounting.

According to the invention, a method for forming a protruding electrode, comprises the steps of:

forming a first film of an organic or polymeric material on the top portion of a protruding electrode formed on a protruding-electrode-forming plane;

then forming a second film of a polymeric material on the protruding-electrode-forming plane to bury the base portion of the protruding electrode; and removing the first film after the second film is cured;

wherein the first film is of the organic or polymeric material which has no affinity with the polymeric material of the second film.

Namely, the protruding electrode formed according to the invention has a top portion protruding from the second film and a base portion buried in the second film.

Furthermore, the second film is gathered around the protruding electrode by surface tension when it is cured, and it is therefore formed so that its thickness is greatest at a point where it contacts the protruding electrode and is gradually reduced with the distance from the protruding electrode, i.e., formed to be skirt-shaped around the side portion of the protruding electrode with a top point contacting the protruding electrode. Therefore, the stress occurring at the protruding electrode can be easily dispersed.

Furthermore, even when the material of the second film contacts the first film, it does not remain on the first film, i.e., the top portion of the protruding electrode since the first film has no affinity with the second film.

According to another aspect of the invention, a method for forming a protruding electrode, comprises the steps of;

forming a first film of an organic or polymeric material on the top portion of a protruding electrode formed on a protruding-electrode-forming plane; and then forming a second film of a polymeric material on the protruding-electrode-forming plane to bury the base portion of the protruding electrode;

wherein the first film is of the organic or polymeric material which has no affinity with the polymeric material of the second film and can be removed by heat to be applied in the step of forming the second film.

Namely, the protruding electrode formed according to the above aspect of the invention has a top portion protruding from the second film and a base portion buried in the second film.

Furthermore, the second film is gathered around the protruding electrode by surface tension when it is cured, and it is therefore formed so that its thickness is greatest at a point where it contacts the protruding electrode and is gradually reduced with the distance from the protruding electrode, i.e., formed to be skirt-shaped around the side portion of the protruding electrode with a top point contacting the protruding electrode. Therefore, the stress occurring at the protruding electrode can be easily dispersed.

Furthermore, even when the material of the second film contacts the first film, it does not remain on the first film, i.e., the top portion of the protruding electrode since the first film has no affinity with the second film. Also, without conducting the step of removing the first film, the first film can be automatically removed by heating in the step of forming the second film.

BRIEF DESCRIPTION OF THE DRAWINGS

The invention will be explained in more detail in conjunction with the appended drawings, wherein.

DESCRIPTION OF THE PREFERRED EMBODIMENTS

A method for forming a bump in the preferred embodiment will be explained in FIGS. 4 to 6C. This embodiment is taken as an example where a solder bump as a protruding electrode is formed on a semiconductor chip.

Figure 4:
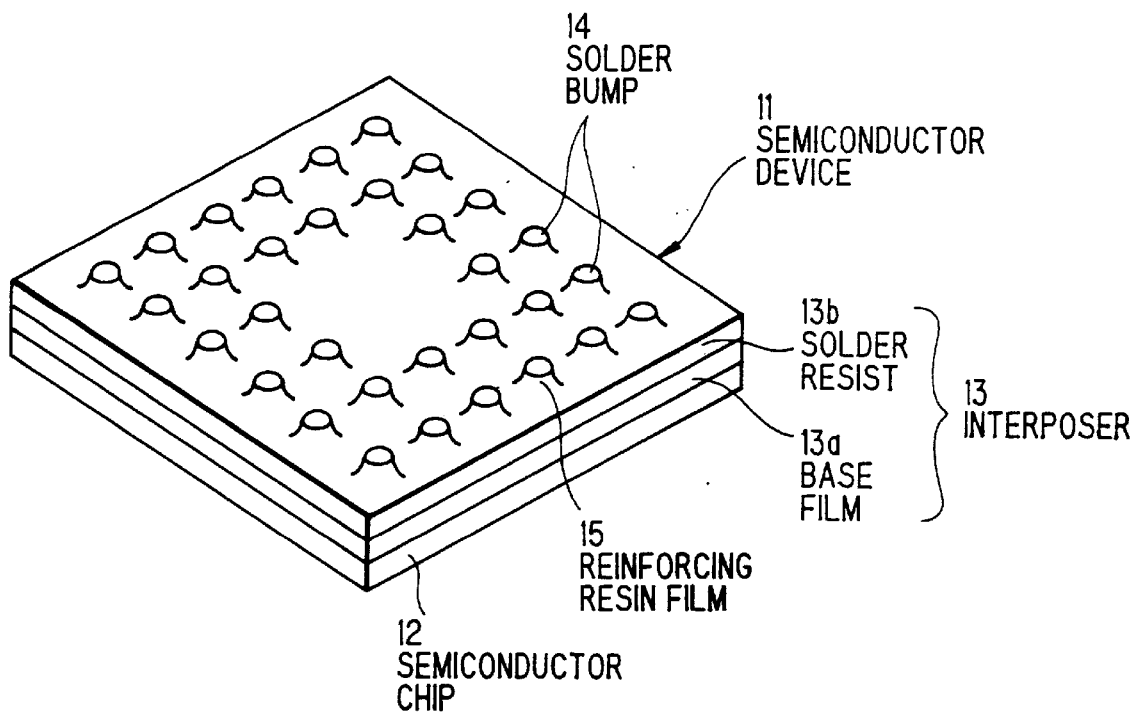
FIG. 4 is a perspective view showing a semiconductor device where solder bumps are formed by using a method for forming a protruding electrode in a preferred embodiment according to the invention.

Referring to FIG. 4, 11 is a semiconductor device where solder bumps are formed according to the method for forming a bump in this embodiment. On the semiconductor device 11, there are formed solder bumps 14 through an interposer 13 on an electrode-formed plane of a semiconductor chip 12. The solder bumps 14 are protruding electrodes according to the embodiment of the invention.

Figure 5:
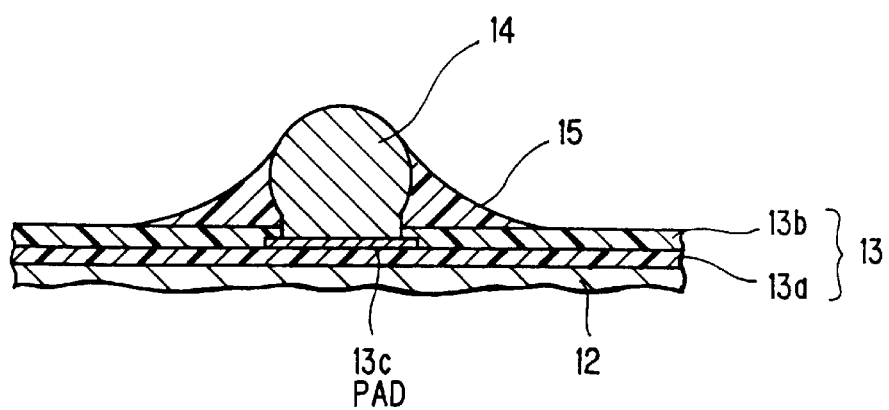
FIG. 5 is an enlarged cross sectional view showing main part of the semiconductor device in FIG. 4, and FIGS. 6A to 6C are cross sectional views showing the method for forming a protruding electrode in the preferred embodiment according to the invention.

The interposer 13 is, as shown in FIG. 5, composed of a base film 13a of polyimide which is fixed to the semiconductor chip 12, and solder resist 13b composed of polyimide system synthetic resin which is formed on the base film 13a. Also, a pad 13c for solder bump is provided on a wiring pattern formed on the base film 13a, and the solder bump 14 is bonded to the pad 13c. The wiring pattern is connected through a through-hole(not shown) penetrating through the base film 13a to an electrode of the semiconductor chip 12.

In this embodiment, the solder bump 14 is bonded to the pad 13c by fusing while placing a solder ball on the pad 13c and then cooling. Also, there are formed many solder bumps 14 on the entire electrode-formed plane of the semiconductor chip 12.

In FIG. 5, 15 is a reinforcing resin film, which covers the side portion of the solder bump 14. In this embodiment, the reinforcing resin film 15 is of polyimide system synthetic resin which can firmly adhere to the interposer 13. Also, the reinforcing resin film 15 is formed on the surface of the interposer 13 so that the base portion(about half portion on the side of the interposer 13) of the solder bump 14 is buried and the top portion of the solder bump 14 is exposed.

Also, the reinforcing resin film 15 is formed so that its thickness is greatest at a point where it contacts the solder bump 14 and is gradually reduced with the distance from the solder bump 14, by using a process described later. In other words, the reinforcing resin film 15 is formed to be skirt-shaped around the side portion of the solder bump 14 with a top point contacting the solder bump 14. By forming the skirt-shaped reinforcing resin film 15, there is formed no resin film 15 or thinned resin film 15 on an area between two solder bumps 14 on the interposer 13.

Next, a method for forming the reinforcing resin film 15 will be explained in FIGS. 6A to 6C.

Figure 6A:
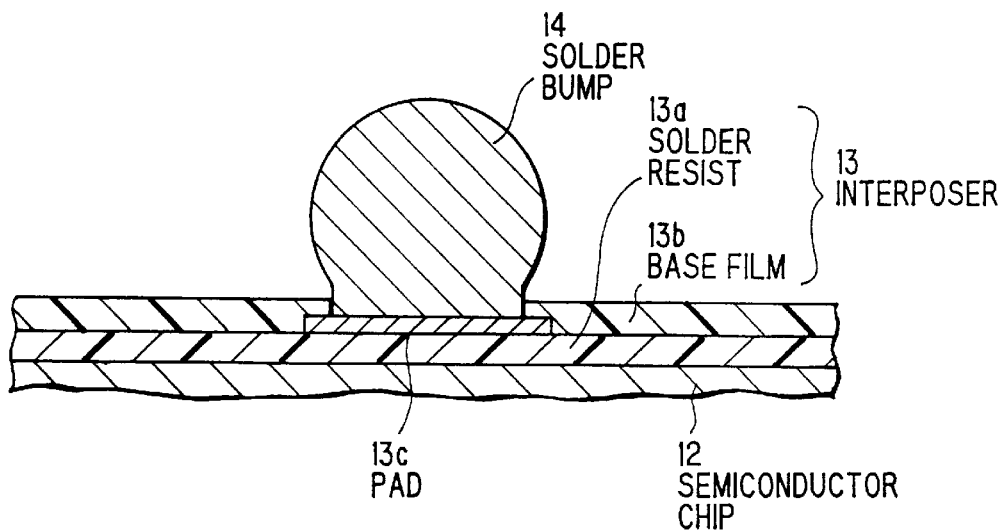
Figure 6B:
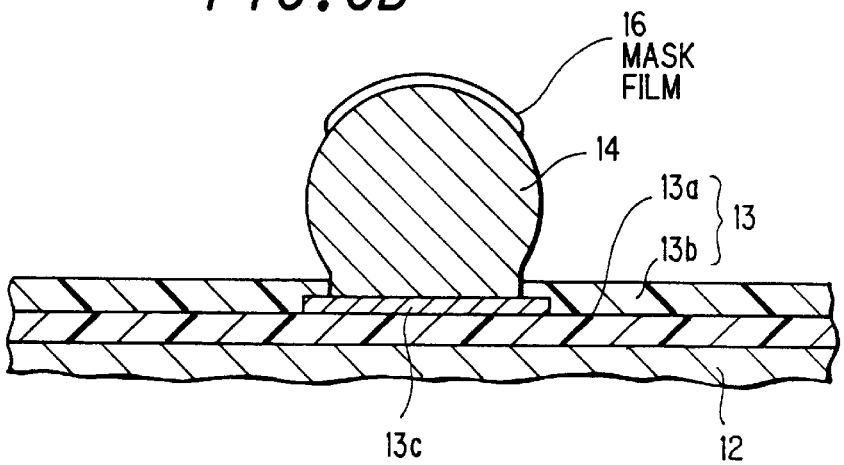
Figure 6C:
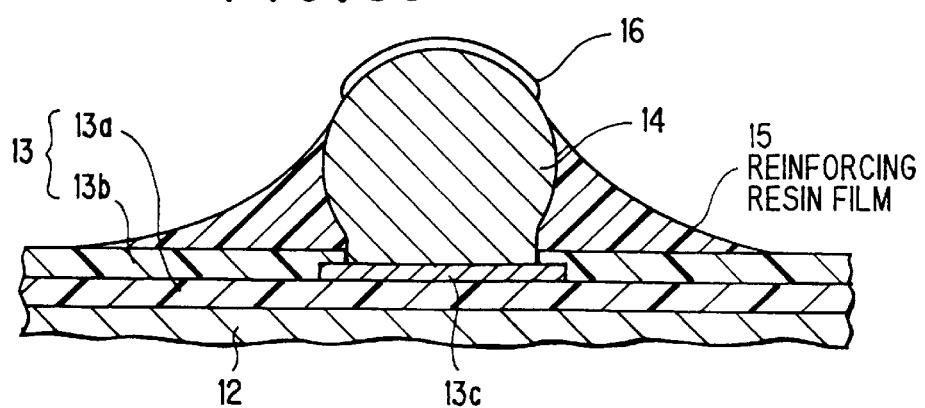

First, as shown in FIG. 6A, the solder bump 14 is formed, and then a mask film 16 is formed on the top portion(area) of the solder bump 14. The mask film 16 is of a synthetic resin material having no affinity with the resin film 15. Herein, 'affinity' means properties that two materials can be mixed or fused with each other and one material can wet over the surface of the other material. Namely, 'having no affinity' means that the two materials neither wet nor fuse with each other. In this embodiment, the mask film 16 is fluorine system synthetic resin and the reinforcing resin film 15 is polyimide system synthetic resin.

In this embodiment, in order to form the mask film 16 only on the top portion of the solder bump 14, offset printing is used. In detail, coating the entire outer surface of a rubber roller(not shown) with fluorine system synthetic resin which is dissolved in a solvent to have uniform thickness, then rotating the rubber roller while pressing it against the top portion of the solder bump 14, fluorine system synthetic resin is transferred from the rubber roller to the solder top portion(area) of the bump 14. Then, evaporating the solvent of fluorine system synthetic resin, fluorine system synthetic resin is fixed on the solder bump 14, thereby forming the mask film 16.

After forming the mask film 16, the synthetic resin material for the reinforcing resin film 15 is coated on the interposer 13 while placing the bump-formed plane upward. In this embodiment, a solution that polyimide system resin is dissolved in a solvent containing, e.g., a NMP solution, is coated on the interposer 13 by spray coating.

The mask film 16 on the solder 14 is of the material having no affinity with the reinforcing resin film 15. Therefore, even when the solution to be coated contacts the mask film 16, it is repelled thereby without wetting over the mask film 16. Namely, the solution is coated on the interposer 13 while exposing the mask film 16. Meanwhile, the amount of the coated solution is set so that the base portion(not covered with the mask film 16 and exposed to the outside) of the solder bump 14 is buried.

After coating the synthetic resin material on the interposer 13, this is cured by heating in a furnace, thereby forming the reinforcing resin film 15.

Polyimide system synthetic resin to form the reinforcing resin film 15, which is thermosetting resin, has to be heated to cure the reinforcing resin film 15. In the heating, when the curing temperature is lower than the melting point of solder, the shape of solder is kept as it is, and, when the curing temperature is higher than the melting point of solder, the solder bump 14 is melted but its shape is kept to be nearly globular by surface tension.

Also, the reinforcing resin film 15 is gathered round the solder bump 14 by surface tension, and its volume is reduced due to the evaporation of solvent when it is cured. Therefore, the reinforcing resin film 15 is formed so that its thickness is greatest at a point where it contacts the solder bump 14 and is gradually reduced with the distance from the solder bump 14, i.e., formed to be skirt-shaped around the side portion of the solder bump 14 with a top point contacting the solder bump 14.

Next, the mask film 16 is removed from the solder bump 14. In this embodiment, the removing of the mask film 16 is conducted by dissolving the mask film 16 in a solvent by which the fluorine system synthetic resin is dissolved and the polyimide system synthetic resin is not dissolved. For example, the mask film 16 is removed by rubbing the solder bump 14 with a cloth wet by the solvent or by spraying the solvent on the solder bump 14 and washing.

By removing the mask film 16 from the solder bump 14, the solder bump 14 with its top portion exposed and its base portion buried in the reinforcing resin film 15, as shown in FIG. 5, is formed.

Forming thus the solder bump 14 and reinforcing resin film 15, the process of making the semiconductor device 11 is ended. Then, the semiconductor device 11 obtained is transferred into a reflow furnace while placing the top of the solder bump 14 on a pad for soldering of a mount substrate (not shown), and then the solder bump 14 is melted and then cooled to mount the semiconductor device 11 on the mount substrate. After mounting, when the semiconductor device 11 and mount substrate are heated by heat generated by the operation of the semiconductor chip 12 or by the other electronic components, there a shearing stress(thermal stress) occurs at the base portion of the bump 14 due to an expansion difference between them.

However, the base portion of the solder bump 14 is buried in the reinforcing resin film 15 and reinforced thereby. Therefore, it can prevent the solder bump 14 from shifting by the shearing stress.

Figure 1:
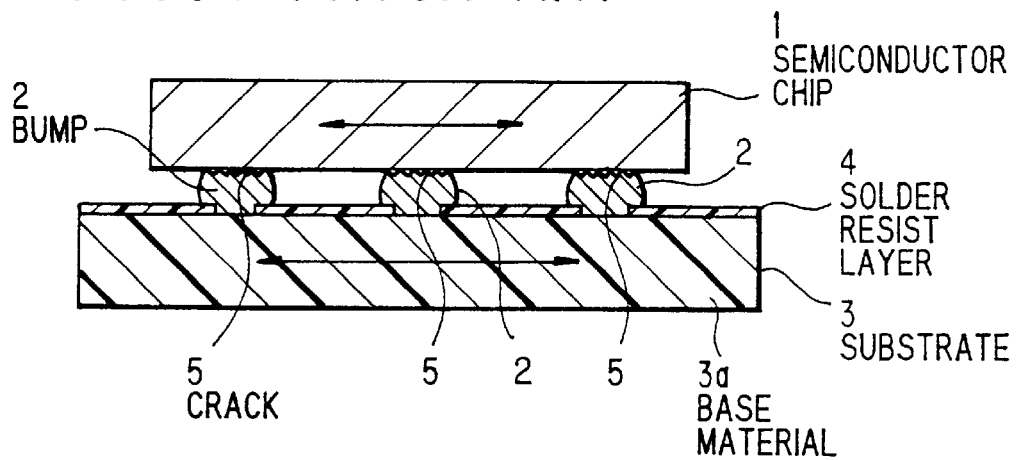
FIG. 1 is a cross sectional view showing an example of conventional flip chip mounting.
Figure 2:
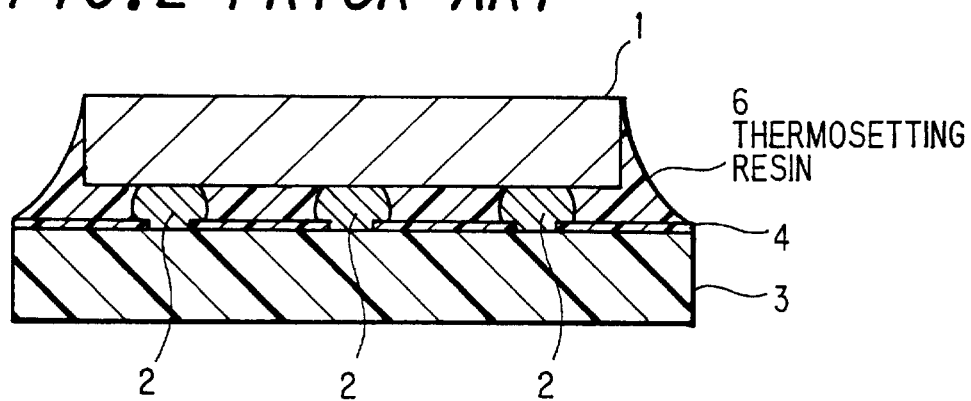
FIG. 2 is a cross sectional view showing a conventional mount structure.
Figure 3:
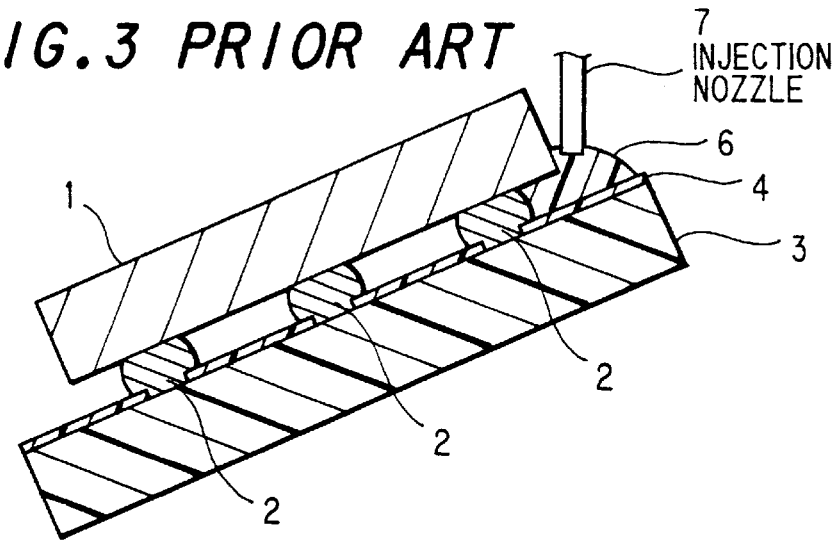
FIG. 3 is a cross sectional view showing a resin-injecting process in the structure in FIG. 2

Furthermore, the reinforcement is provided only to the base portion of the solder bump 14. Namely, between the semiconductor device 11 and the mount substrate which are bonded to each other by the solder bump 14, there exists no conventional-type reinforcing member as the thermosetting resin 6 in FIG. 2. Therefore, the two members can be separated by melting the solder bump 14 by heating again even after mounting. Thereby, even when one of the two members is defective, it can be easily replaced.

Furthermore, the reinforcing resin film 15 is gathered round the solder bump 14 by surface tension when it is cured, and it is therefore formed so that its thickness is greatest at a point where it contacts the solder bump 14 and is gradually reduced with the distance from the solder bump 14, i.e., formed to be skirt-shaped around the side portion of the solder bump 14 with a top point contacting the solder bump 14. Therefore, the stress occurring at the solder bump 14 can be easily dispersed.

Furthermore, even when the material of the reinforcing resin film 15 contacts the mask film 16, it does not remain on the mask film 16, i.e., the top portion of the solder bump 14 since the mask film 16 has no affinity with the reinforcing resin film 15. Thus, the top portion of the solder bump 14 is cleanly exposed after removing the mask film 16, therefore optimally soldered without having a remainder such as the material of the reinforcing resin film 15. Moreover, the material of the reinforcing resin film 15 can be coated on the bump-formed plane of the interposer 13 without avoiding the solder bump 14.

Furthermore, by using offset printing to form the mask film 16 on the top portion of the solder bump 14 as described above, the mask films 16 can be uniformly formed on a lot of solder bumps 14, The reinforcing resin films 15 for reinforcing the base portion of the solder bump 14 can have uniform heights at all the solder bumps 14.

Also, the process of removing the mask film 16 can be simplified by dissolving it with the solvent.

Though the solder bump 14 is used in this embodiment, another protruding electrode such as gold bump may be used.

The method for forming a protruding electrode according to the invention can be also applied to a solder bump for mounting a printed circuit board mounted with a semiconductor chip, e.g., a BGA-type semiconductor device, on a substrate.

Also, the material of the bump-formed plane(interposer 13), the materials of the reinforcing resin film 15 and mask film 16, and the method for forming these films and the method for removing the mask film 16 can be optionally altered or changed as described below.

1) Materials of Reinforcing Resin Film 15:

The material of the reinforcing resin film 15 is preferably to adhere firmly to a bump and a material of bump-formed plane. Materials of the reinforcing resin film 15 adaptable to materials of bump-formed plane and their relative adhesion strengths are shown in Table 1. Meanwhile, the materials of the reinforcing resin film 15 listed below also have sufficient adhesion strengths to bumps.

TABLE 1

| Material of Bump-Formed Plane | Material of Resin Film 15 | Adhesion Strength |
|---|---|---|
| polyimide system s.r. (present embodiment) | polyimide system s.r. | high |
| | epoxy system s.r. | medium |
| | phenol system s.r. | medium |
| glass epoxy substrate | epoxy system s.r. | high |
| | phenol system s.r. | high |
| | acryl system s.r. | medium |
| | polyimide system s.r. | low |
| ceramic substrate | phenol system s.r. | high |
| | epoxy system s.r. | high to medium |
| | acryl system s.r. | medium |
| | polyimide system s.r. | medium |
| silicon chip (flip chip) | polyimide system s.r. | high |
| | epoxy system s.r. | high |
| | phenol system s.r. | high | s.r.: synthetic resin

Of the above synthetic resins for the reinforcing resin film 15, epoxy system synthetic resin is preferably cheap.

2) Materials of Mask Film 16:

Any materials which have no affinity with the material of the reinforcing resin film 15 can be used as the mask film 16. Typical combinations of these materials and degrees of non-affinity therebetween are shown in Table 2.

TABLE 2

| Material of Resin Film 15 | Material of Mask Film 16 | Degree of Non-Affinity |
|---|---|---|
| polyimide system s.r. (present embodiment) | fluorine system s.r. | high |
| | fluorine system s.o. | high |
| | paraffin system resin | low |
| | paraffin system oil | low |

TABLE 2-continued

| Material of Resin Film 15 | Material of Mask Film 16 | Degree of Non-Affinity |
| --- | --- | --- |
| epoxy system s.r. | fluorine system s.r. | high |
| (solvent: ketone, alcohol) | fluorine system s.o. | high |
|  | paraffin system resin | low |
|  | paraffin system oil | low |
| phenol system s.r. | fluorine system s.r. | high |
| (solvent: ketone, alcohol) | fluorine system s.o. | high |
|  | paraffin system resin | low |
|  | silicone system resin | medium |
|  | silicone system oil | medium |
| acryl system s.r. | fluorine system s.r. | high |
| (water-soluble) | fluorine system s.o. | high |
|  | paraffin system resin | high |
|  | paraffin system oil | high |
|  | silicone system resin | medium |
|  | silicone system oil | medium | s.r.: synthetic resin
s.o.: synthetic resin

Of the above materials of the mask film 16, fluorine system synthetic resin is optimum but paraffin system resin and oil are prefer ably cheap.

3) Method for Forming Mask Film 16:

To form the mask film 16 on the top portion of the solder bump 14, a printing process using a mask(not shown) may be used. In detail, by overlapping a mask where only parts corresponding to the top portion of the solder bump 14 are exposed on the semiconductor chip 12 or BGA-type semiconductor device, then coating a material of the mask film 16 on the mask by using a squeegee, the mask film 16 is formed.

Also, the mask film 16 may be formed by dipping the top portion of the solder bump 14 into a solution containing a material of the mask film 16. In this case, the solution is maintained in a dish to have a certain depth, and then the top portion of the solder bump 14 is dipped into the solution so that it contacts the bottom of the dish.

When these methods are used to form the mask film 16, the same effects as the above embodiment can be obtained.

4) Method for Removing Mask Film 16:

To remove the mask film 16, ultrasonic cleaning other than the process of dissolving with solvent may be used. Mask film materials removable by ultrasonic cleaning are paraffin system resin, paraffin system oil silicone system resin and silicone system oil which have a adhesion relatively low to the solder bump 14.

Also, fluorine system synthetic oil, paraffin system resin and paraffin system oil listed as mask films 16 in Table 2, which can be evaporated or decomposed at a temperature where the reinforcing resin film 15 is cured, may be removed by using such a property. Namely, the mask film 16 of these materials can be removed when the reinforcing resin film 15 is heated to cure. Thus, the process of removing the mask film 16 after curing the reinforcing resin film 15 is not necessary.

5) Method for Forming Reinforcing Resin Film 15:

Any processes where the thickness of the reinforcing resin film 15 can be precisely controlled can be used. For example, other than spray coating in the above embodiment, spin coating, potting, mask printing and dipping may be used.

Spin coating is conducted by dropping a solution containing a material of the reinforcing resin film 15 on the interposer 13 and rotating the interposer 13 with the semiconductor chip 12 at a high rate.

Potting is conducted by dropping a solution containing a material of the reinforcing resin film 15 on the entire bump formed plane of the interposer 13.

Mask printing is conducted by positioning a mask where part corresponding to the solder bump 14 and surrounding is opened over the interposer 13, then coating a solution containing a material of the reinforcing resin film 15 on the mask by a squeegee.

Dipping is conducted by dipping the interposer 13 with the semiconductor chip 12 into a solution containing a material of the reinforcing resin film 15.

EXAMPLE

The semiconductor device 11 shown in FIG. 4 is mounted on a mount substrate and a reliability test under the following conditions is conducted. As a result, it is proved that the temperature-cycle resistance is improved.

temperature cycle condition: −40 to 125° C.

without reinforcing resin film: 250 cycles with reinforcing resin film 15: 1000 cycles Meanwhile, a sample for this test has a package size of 7.5 mm square, a diameter of the solder bump 14 of 200 to 250 $\mu$m and a height(thickness) of the reinforcing resin film 15 around the solder bump 14 of 100 to 150 $\mu$m.

ADVANTAGES OF THE INVENTION

In accordance with one aspect of the invention the protruding electrode can be formed having a top portion protruding from the second film and a base portion buried in the second film. Thus, the base portion of the protruding electrode can be reinforced by the second film. Therefore, even when two members connected through the protruding electrode have thermal expansion coefficients highly different from each other, a crack due to thermal stress does not occur at the protruding electrode or can be significantly reduced.

As a result, it allows a long-lived device.

Also, the reinforcement is provided only to the base portion of the protruding electrode. Namely, between the two members which are connected to each other through the protruding electrode, there exists no conventional-type reinforcing member. Therefore, the two members can be separated by melting the protruding electrode by heating again even after mounting. Thereby, even when one of the two members is defective, it can be easily exchanged, Furthermore, the second film is gathered around the protruding electrode by surface tension when it is cured, and it can be therefore formed so that its thickness is greatest at a point where it contacts the protruding electrode and is gradually reduced with the distance from the protruding electrode, i.e., formed to be skirt-shaped around the side portion of the protruding electrode with a top point contacting the protruding electrode. Therefore, stress occurring at the protruding electrode can be easily dispersed. As a result, in cooperation with the reinforcement by the second film itself, a resistance against thermal stress in the protruding electrode can be improved.

Furthermore, even when the material of the second film contacts the first film, it does not remain on the first film, i.e., the top portion of the protruding electrode since the first film has no affinity with the second film. Thus, the top portion of the protruding electrode is cleanly exposed after removing the first film, therefore optimally soldered without having a remainder such as the material of the second film. Moreover, the material of the second film can be coated on the protruding-electrode-forming plane without avoiding the protruding electrode. Thereby, the process of coating the material of the second film can be simplified.

In accordance with yet another aspect of the invention and, the first film can be removed by a simplified operation. Therefore, the cost for removing the first film can be reduced, In accordance with yet another the invention defined below in claim 4, the protruding electrode can be formed having a top portion protruding from the second film and a base portion buried in the second film. Thus, the base portion of the protruding electrode can be reinforced by the second film. Therefore, even when two members connected through the protruding electrode have thermal expansion coefficients highly different from each other, a crack due to thermal stress does not occur at the protruding electrode or can be significantly reduced, As a result, it allows a long-lived device.

Also, the reinforcement is provided only to the base portion of the protruding electrode. Namely, between the two members which are connected to each other through the protruding electrode, there exists no conventional-type reinforcing member. Therefore, the two members can be separated by melting the protruding electrode by heating again even after mounting. Thereby, even when one of the two members is defective, it can be easily exchanged.

Furthermore, the second film is gathered around the protruding electrode by surface tension when it is cured, and it can be therefore formed so that its thickness is greatest at a point where it contacts the protruding electrode and is gradually reduced with the distance from the protruding electrode, i.e., formed to be skirt-shaped around the side portion of the protruding electrode with a top point contacting the protruding electrode. Therefore, the stress occurring at the protruding electrode can be easily dispersed. As a result, in cooperation with the reinforcement by the second film itself, resistance against thermal stress in the protruding electrode can be improved.

Furthermore, even when the material of the second film contacts the first film, it does not remain on the first film, i.e., the top portion of the protruding electrode since the first film has no affinity with the second film. Also, without conducting the step of removing the first film, the first film can be automatically removed by heating in the step of forming the second film. As a result, the total number of steps can be reduced.

Thus, when forming the second film, the top portion of the protruding electrode is cleanly exposed after removing the first film, therefore optimally soldered without having a remainder such as the material of the second film. Moreover, the material of the second film can be coated on the protruding electrode-forming plane without avoiding the protruding electrode. Thereby, the process of coating the material of the second film can be simplified.

In accordance with another aspect of the invention to the first films can be uniformly formed on a large number of the protruding electrodes.

Therefore, the second films for reinforcing the base portions of the protruding electrodes can be also formed with uniform heights. Thus, the reinforcement by the second films can be evenly given to a large number of the protruding electrodes.

Although the invention has been described with respect to specific embodiment for complete and clear disclosure, the appended claims are not to be thus limited but are to be construed as embodying all modification and alternative constructions that may be occurred to one skilled in the art which fairly fall within the basic teaching here is set forth.

What is claimed is:

1. A method for forming a plurality of protruding electrodes in spaced relationship to each other, comprising the steps in sequence of:

forming a first film of an organic or polymeric material on the top portion of each protruding electrode formed on a pad;

forming a second film of a polymeric material on said pad to bury the base portion of said protruding electrode while leaving the top portion of each said protruding electrode exposed, the thickness of said second film being greatest where it contacts each said protruding electrode, and gradually reducing in thickness with distance from each protruding electrode; and removing said first film after said second film is cured;

wherein said first film is of an organic or polymeric material which has no affinity with said polymeric material of said second film.

2. A method for forming a protruding electrode, according to claim 1, wherein:

said step of removing said first film is conducted by dissolving said first film into a solvent.

3. A method for forming a protruding electrode, according to claim 1, wherein:

said step of removing said first film is conducted by using ultrasonic cleaning.

4. A method for forming a plurality of protruding electrodes in space relationship to each other, comprising the steps in sequence of:

forming a first film of an organic or polymeric material on the top portion of each protruding electrode formed on a pad; and forming with heating a second film of a polymeric material on said pad to bury the base portion of each said protruding electrode while leaving the top portion of each said protruding electrode exposed, the thickness of said second film being greatest where it contacts each said protruding electrode, and gradually reducing in thickness with distance from each protruding electrode;

wherein said first film is of an organic or polymeric material which has no affinity with said polymeric material of said second film and can be removed by heat to be applied in said step of forming said second film.

5. A method for forming a protruding electrode, according to claim 1, wherein:

said step of forming said first film is conducted by a printing process using a mask.

6. A method for forming a protruding electrode, according to claim 2, wherein:

said step of forming said first film is conducted by a printing process using a mask.

7. A method for forming a protruding electrode, according to claim 3, wherein:

said step of forming said first film is conducted by a printing process using a mask.

8. A method for forming a protruding electrode, according to claim 4, wherein:

said step of forming said first film is conducted by a printing process using a mask.

9. A method for forming a protruding electrode, according to claim 1, wherein:

said step of forming said first film is conducted by pressing a transferring member with a solution containing said organic or polymeric material of said first film on its surface against said top portion of said protruding electrode.

10. A method for forming a protruding electrode, according to claim 2, wherein:

said step of forming said first film is conducted by pressing a transferring member with a solution containing said organic or polymeric material of said first film on its surface against said top portion of said protruding electrode.

11. A method for forming a protruding electrode, according to claim 3, wherein:

said step of forming said first film is conducted by pressing a transferring member with a solution containing said organic or polymeric material of said first film on its surface against said top portion of said protruding electrode.

12. A method for forming a protruding electrode, according to claim 4, wherein;

said step of forming said first film is conducted by pressing a transferring member with a solution containing said organic or polymeric material of said first film on its surface against said top portion of said protruding electrode.

13. A method for forming a protruding electrode, according to claim 1, wherein:

said step of forming said first film is conducted by dipping said top portion of said protruding electrode into a solution containing said organic or polymeric material of said first film.

14. A method for forming a protruding electrode, according to claim 2, wherein;

said step of forming said first film is conducted by dipping said top portion of said protruding electrode into a solution containing said organic or polymeric material of said first film.

15. A method for forming a protruding electrode, according to claim 3, wherein:

said step of forming said first film is conducted by dipping said top portion of said protruding electrode into a solution containing said organic or polymeric material of said first film.

16. A method for forming a protruding electrode, according to claim 4, wherein;

said step of forming said first film is conducted by dipping said top portion of said protruding electrode into a solution containing said organic or polymeric material of said first film.

* * * * *